(12) United States Patent
Tuncer

(10) Patent No.: US 11,538,738 B1
(45) Date of Patent: Dec. 27, 2022

(54) ISOLATED TEMPERATURE SENSOR DEVICE

(71) Applicant: Texas Instruments Incorporated, Dallas, TX (US)

(72) Inventor: Enis Tuncer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/390,900

(22) Filed: Jul. 31, 2021

(51) Int. Cl.
| | |
|---|---|
| *H01L 23/495* | (2006.01) |
| *H01L 21/66* | (2006.01) |
| *H01L 23/58* | (2006.01) |
| *H01L 23/528* | (2006.01) |

(52) U.S. Cl.
CPC ........ *H01L 23/49503* (2013.01); *H01L 22/14* (2013.01); *H01L 23/528* (2013.01); *H01L 23/585* (2013.01)

(58) Field of Classification Search
CPC . H01L 22/14; H01L 23/49503; H01L 23/528; H01L 23/585
See application file for complete search history.

(56) References Cited

U.S. PATENT DOCUMENTS

2004/0188795 A1* 9/2004 Ohkubo ............. H01L 27/0629
257/467
2015/0262708 A1* 9/2015 Lee ...................... G01L 1/2293
365/191

* cited by examiner

*Primary Examiner* — Allan R Wilson
(74) *Attorney, Agent, or Firm* — Dawn Jos; Frank D. Cimino

(57) ABSTRACT

In a described example, an apparatus includes: a package substrate including a die pad configured for mounting a semiconductor die, a first lead connected to the die pad, and a second lead and a third lead; and a semiconductor die including a temperature sensor mounted on the die pad. The semiconductor die includes a first metallization layer being a metallization layer closest to the active surface of the semiconductor die, and successive metallization layers overlying the previous metallization layer, the metallization layers including a respective conductor layer in a dielectric material for the particular metallization layer and conductive vias; and the temperature sensor formed of the conductor layer in an uppermost metallization layer and coupled to the second lead and to the third lead. The semiconductor die includes a high voltage ring formed in the uppermost metallization layer, spaced from and surrounding the temperature sensor.

21 Claims, 11 Drawing Sheets

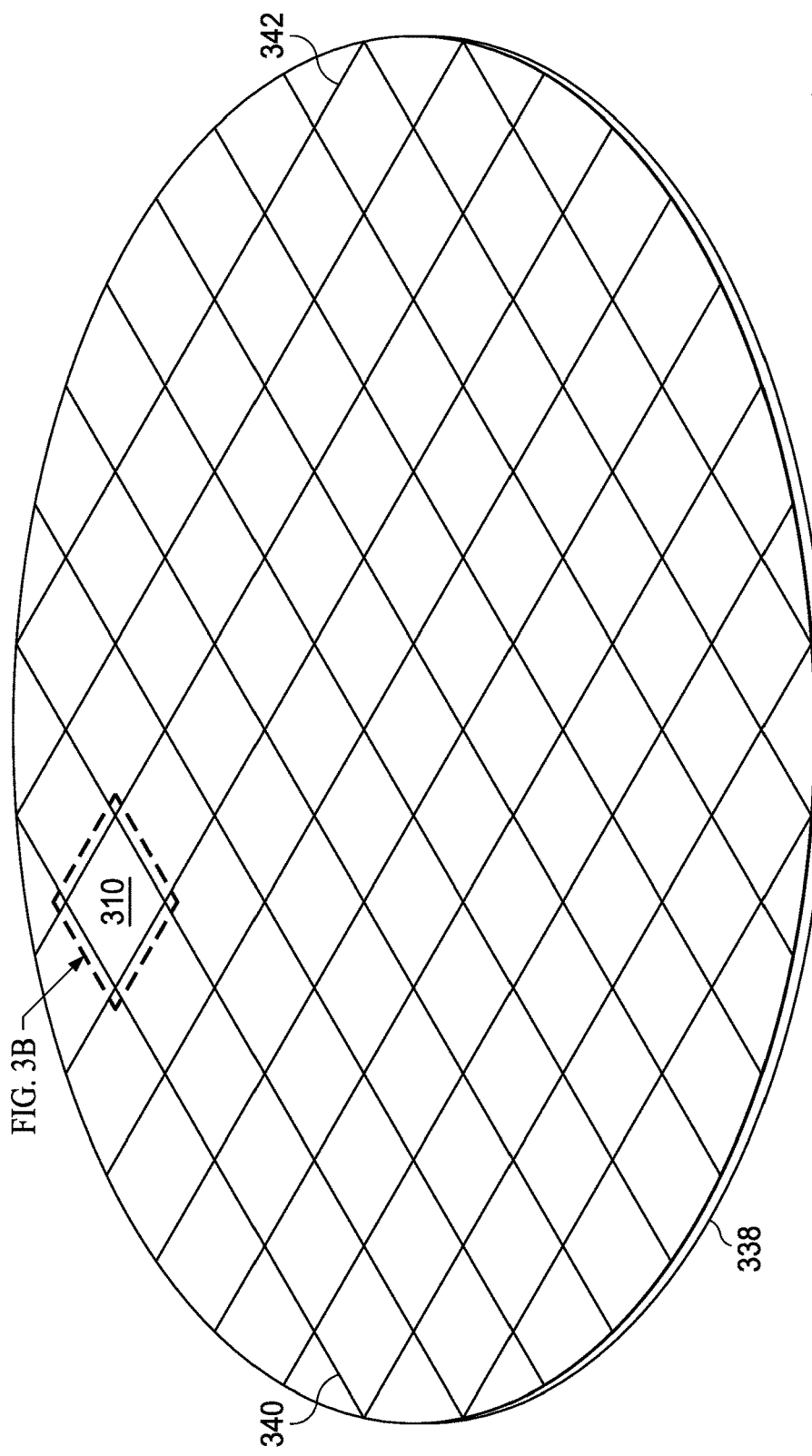
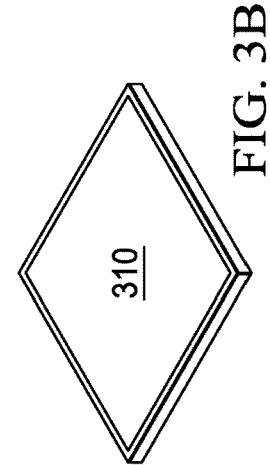
FIG. 3A
FIG. 3B

ISOLATED TEMPERATURE SENSOR DEVICE

TECHNICAL FIELD

This relates generally to packaging semiconductor temperature sensor devices, and more particularly to packaging for semiconductor temperature sensors including electrical isolation.

BACKGROUND

For semiconductor temperature sensors, a semiconductor device includes components with a parameter that varies with temperature. The parameter should vary in a manner so that the parameter can be used to develop a signal that varies predictably with temperature. The device is a temperature sensor. Semiconductor temperature sensors can use an impedance, capacitance, inductance or a transistor voltage threshold as a temperature sensor device, and circuitry in combination with the device can be implemented to output a signal, a current or voltage, that depends on the temperature sensor device and which varies with temperature. In an example a capacitance is used which has permittivity that varies with temperature. In another example, an impedance or pairs of impedances can be used. In an example a pair of impedances is used with a current source in a proportional-to-absolute-temperature ("PTAT") circuit. Delta-VBE (base-emitter voltage) temperature sensing can be used, using bipolar transistors with changes in a base-to-emitter voltage characteristic over temperature to sense temperature.

When sensing temperature for high voltage applications, the semiconductor temperature sensor is necessarily exposed to the high voltage. Integrated circuit devices are used for delivering increasingly higher voltages, for example hundreds or thousands of volts, to a load. Peak or surge voltages can be several kilovolts. The area of a system where a temperature sensor is needed, for example a bus or a large conductor, may also have a very high voltage on it. The semiconductor temperature sensor may not be capable of withstanding the electric field associated with the high voltage. Failures in the semiconductor temperature sensors can occur due to dielectric breakdown when the voltage exceeds the dielectric breakdown voltage of the semiconductor device. Electrical isolation is needed for the temperature sensor device, even while the temperature sensor is thermally coupled to a conductor, bus, or other surface of interest. Optical sensors are sometimes used to sense temperature and to achieve the needed electric isolation, however not all applications provide a signal that is appropriate for optical sensing. Improvements in semiconductor temperature sensors are needed.

SUMMARY

In a described example, an apparatus includes: a package substrate including a die pad configured for mounting a semiconductor die, a first lead connected to the die pad, and a second lead and a third lead spaced from and isolated from the first lead and the die pad; and a semiconductor die including a temperature sensor mounted on the die pad. The semiconductor die includes: a semiconductor substrate having a backside surface conductively mounted to the die pad and having an active surface opposite the backside surface; successive metallization layers stacked over the active surface of the semiconductor die, a first metallization layer being the metallization layer closest to the active surface, and the successive metallization layers overlying a previous metallization layer, an uppermost metallization layer being furthest from the active surface, the successive metallization layers comprising a respective conductor layer in a dielectric material for a particular metallization layer, and including conductive vias extending through the dielectric material from the respective conductor layer to adjacent metallization layers. The temperature sensor is formed of the respective conductor layer in the uppermost metallization layer; and a high voltage ring formed of the respective conductor layer in the uppermost metallization layer is spaced from the temperature sensor and surrounds the temperature sensor. Bond pads are formed of the conductor layer in the uppermost metallization layer, configured for making an electrical connection; and electrical connections couple the bond pads to the second lead and to the third lead.

BRIEF DESCRIPTION OF THE DRAWINGS

FIG. 3A is a projection view of a semiconductor wafer including semiconductor dies, FIG. 3B is a projection view of a semiconductor die.

DETAILED DESCRIPTION

Figure 1:
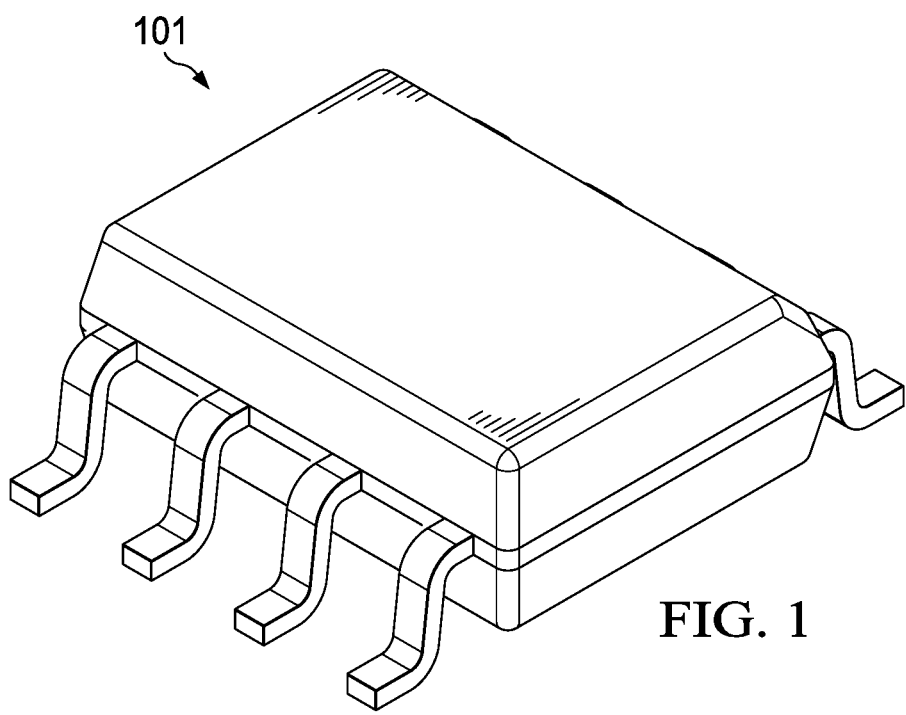
FIG. 1 is a projection view of a small outline integrated circuit (SOIC) semiconductor device package.

Corresponding numerals and symbols in the different figures generally refer to corresponding parts, unless otherwise indicated. The figures are not necessarily drawn to scale.

Elements are described herein as "coupled." As used herein, the term "coupled" includes elements that are directly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or can include active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs). The semiconductor die can be a micro electro-mechanical system (MEMS) device, such as a digital micromirror device (DMD). Semiconductor dies for power applications include a discrete power transistor, a gate driver to operate the power transistor, passives such as capacitors, inductors, and resistors needed to implement power circuitry, and intelligent power devices that include protective sensors such as inrush current sensors that add reliability and control to the system. In some applications, these devices may be fabricated of different semiconductor materials, and can be separate semiconductor dies that are mounted in a single device package. In the arrangements, a semiconductor die includes a temperature sensor.

The term "packaged electronic device" is used herein. A packaged electronic device has at least one semiconductor die electronically coupled to terminals and has a package body that protects and covers the semiconductor die. In some arrangements, multiple semiconductor dies can be packaged together. For example, a power metal oxide semiconductor (MOS) field effect transistor (FET) semiconductor die and a second semiconductor die (such as a gate driver die or controller device die) can be packaged together to from a single packaged electronic device. Additional components such as passives can be included in the packaged electronic device. The semiconductor die is mounted to a package substrate that provides conductive leads, a portion of the conductive leads form the terminals for the packaged electronic device. The semiconductor die can be mounted to the package substrate with an active device surface facing away from the package substrate and a backside surface facing and mounted to the substrate. Alternatively, the semiconductor die can be flip-chip mounted with the active surface facing the substrate surface, and the semiconductor die is mounted to the leads of the substrate by conductive columns or solder balls. The packaged electronic device can have a package body formed by a thermoset epoxy resin in a molding process, or by the use of epoxies, plastics, or resins that are liquid at room temperature and are subsequently cured. The package body may provide a hermetic package for the packaged electronic device. The package body may be formed in a mold using an encapsulation process, however, a portion of the leads of the substrate are not covered during encapsulation, these exposed lead portions provide the exposed terminals for the packaged electronic device.

The term "package substrate" is used herein. A package substrate is a substrate arranged to receive a semiconductor die and to support the semiconductor die in a completed semiconductor package. Package substrates include conductive lead frames, which can be formed from copper, aluminum, stainless steel and alloys such as Alloy 42 and copper alloys. The lead frames can include a die pad for mounting the semiconductor die, and conductive leads arranged proximate to the die pad for coupling to bond pads on the semiconductor die using wire bonds, ribbon bonds, or other conductors. The lead frames can be provided in strips or arrays. Dies can be placed on the strips or arrays, the dies placed on a die pad for each packaged device, and die attach or die adhesive can be used to mount the dies to the lead frame die pads. Wire bonds can couple bond pads on the semiconductor dies to the leads of the lead frames. After the wire bonds are in place, a portion of the substrate, the die, and at least a portion of the die pad can be covered with a protective material such as a mold compound.

Alternative package substrates include pre-molded lead frames (PMLF) and molded interconnect substrates (MIS) for receiving semiconductor dies. These substrates can include dielectrics such as liquid crystal polymer (LCP) or mold compound and can include one or more layers of conductive portions in the dielectrics. The lead frames can include plated, stamped and partially etched lead frames, in a partially etched lead frame, two levels of metal can be formed by etching a pattern from one side of the metal lead frame, and then from the other side, to form full thickness and partial thickness portions, and in some areas, all of the metal can be etched to form openings through the partial etch lead frames. Repeated plating and patterning can form multiple layers of conductors spaced by dielectrics, and conductive vias connecting the conductor layers through the dielectrics, the dielectrics can be mold compound. The package substrate can also be tape-based and film-based substrates carrying conductors; ceramic substrates, laminate substrates with multiple layers of conductors and insulator layers; and printed circuit board substrates of ceramic, fiberglass or resin, or glass reinforced epoxy substrates such as flame retardant 4 (FR4) material.

The term "quad flat no-lead" or "QFN" is used herein for a device package. A QFN package has leads that are coextensive with the sides of a molded package body and the leads are on four sides. Alternative flat no-lead packages may have leads on two sides or on one side. These can be referred to as "small outline no-lead" or "SON" packages. No lead packaged electronic devices can be surface mounted to a board. Leaded packages can be used with the arrangements where the leads extend away from the package body and are shaped to form a portion for soldering to a board. A dual in line package, or "DIP", can be used with the arrangements. A thin DIP package arranged with leads extending from the package for surface mounting can be referred to as a small outline integrated circuit or "SOIC" package.

The term "high voltage" is used herein. As used herein a high voltage is a voltage greater than 100 Volts. The arrangements can be used in systems where hundreds or thousands of volts are being delivered to a load. In an example, a 1 kV$_{rms}$ signal was used. Further, even in examples where average voltage is less than these levels, voltage transients must be considered that much greater. In an example where a 300 V$_{rms}$ level is expected on a signal or buss, a transient voltage of 2500 V$_{rms}$ must be handled, since when a signal switches from off to on, or vice versa, a transient of that voltage level can occur. Voltage isolation between isolated elements must be able to handle both the expected load voltages, and the transients that can occur.

In the arrangements, a semiconductor die including a temperature sensor configured to be thermally coupled to an input is provided in a semiconductor device package, where the temperature sensor on the semiconductor die is electrically isolated from the input, which may be at a high voltage. The temperature sensor is electrically isolated by use of an electrically isolated low voltage zone formed in the metallization layers over the active surface of the semiconductor substrate of the semiconductor die. A die pad of a package substrate is coupled to a first input or group of inputs that may be used to sense temperature at a signal or surface. A semiconductor die is mounted to and electrically coupled to the die pad and is thermally coupled to the die pad of the package substrate. A low voltage zone is formed using the dielectric layers of the metallization system over the active surface of the semiconductor substrate. The low voltage zone is electrically isolated from the semiconductor substrate, which may be at a high voltage, by an additional isolation structure that surrounds the low voltage zone.

A temperature sensor is formed in the low voltage zone using the conductive material of the metallization system at an upper metal layer. Bond pads are formed in the upper metal layer that are coupled to the temperature sensor. Electrical connections to the bond pads are made to an isolated portion of the package substrate, to provide input and output signals to the temperature sensor. The isolation structure includes a high voltage ring of conductive material spaced from and surrounding the temperature senor, the high voltage ring is electrically coupled through the metallization system to the semiconductor substrate. The isolation structure is formed using conductive material at the metal layers in the metallization system and using filled conductive vias between the metal layers to form the isolation structure, with a contact to the semiconductor substrate between the lowest metallization layer and the semiconductor substrate. The temperature sensor can be a component formed from the conductive material in the upper metallization layer. The temperature sensor is formed within dielectric material of the metallization system, or in a back end of the line dielectric material such as a passivation layer or protective oxide layer deposited over the semiconductor die. The temperature sensor has an observable characteristic that varies with temperature of the semiconductor die. In an application the temperature sensor provides a signal that varies with temperature and varies in response to change in temperature. In use, the temperature sensor of the arrangements is electrically isolated from the high voltage on a surface being measured, while it is also in thermal contact with the surface, such as a bus or signal path on a system board.

FIG. 1 illustrates in a projection view a dual in line package (DIP) 101 that is useful with certain arrangements. The DIP package 101 can be a small outline integrated circuit (SOIC) package which is thinner and takes less space on an system board than other DIP packages, however other DIP packages can also be used with the arrangements. In FIG. 1, DIP package 101 has eight leads (four are visible in the projection) extending from a body formed by use of a mold compound. Mold compounds used in semiconductor packaging can be used with the arrangements, for example thermoset epoxy resin mold compound can be used to cover the semiconductor die, portions of a package substrate such as a lead frame, and portions of the leads. The process for forming the mold compound of the package is referred to as "encapsulation", although portions of the leads and sometimes portions of a die pad are left exposed from the mold compound to form package terminals or surface mountable surfaces.

Figure 2:
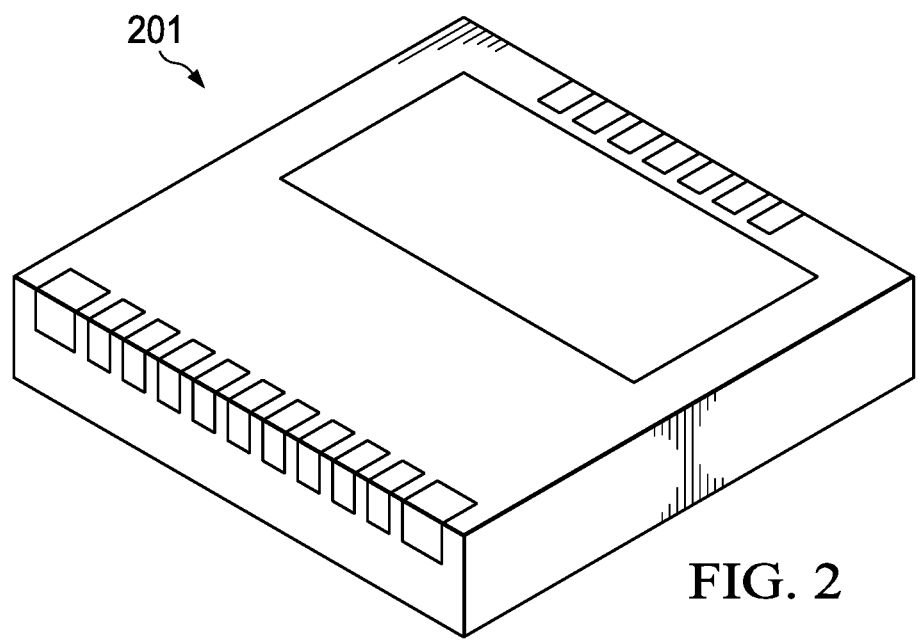
FIG. 2 is a projection view of a quad flat no-lead (QFN) semiconductor device package.

FIG. 2 illustrates, in another projection view, a board side surface of a QFN package useful with the arrangements. In FIG. 2, the QFN package 201 has a body formed from mold compound, and a die pad with an exposed surface, as well as terminals for coupling to a signal bus, conductor, trace or surface to be sensed, and terminals spaced from the die pad that are electrically isolated from the die pad. The QFN package 201 can be surface mounted to a system board using solder and surface mount technology (SMT). QFN packages are increasingly used because the no-leads packages require less board area than leaded packages, such as the DIP 101 in FIG. 1. The semiconductor die of the arrangements can be packaged in a DIP device package, an SOIC device package, in the QFN package, or in another semiconductor package type. Packages with leads or no-leads packages can be used with the arrangements. Small outline transistor (SOT), DIP, SOIC, QFN packages, small outline packages (SOP), small outline no-lead (SON) packages, and quad flat package (QFP) packages, as well as other packages used for semiconductor devices, can be used with the arrangements.

FIGS. 3A and 3B illustrate a semiconductor wafer including a plurality of semiconductor dies, and a single semiconductor die after it has been removed from the semiconductor wafer in a singulation process, respectively. In FIG. 3A, a semiconductor wafer 338 is shown with a plurality of semiconductor dies 310 arranged in rows and columns and spaced from one another by scribe lines 342, shown in a first direction as the semiconductor wafer 338 is oriented in FIG. 3A, and 340, shown in a second direction in FIG. 3A that is normal to the first direction. After semiconductor dies 310 including a temperature sensor are manufactured using semiconductor fabrication processes, the wafer 338 is singulated into unit dies by the use of a saw or laser cutting tool to cut the dies 310 apart from the wafer 338 along the scribe lines 340 and 342. FIG. 3B illustrates a single rectangular semiconductor die such as can be used in the arrangements. A temperature sensor circuit can be formed on the semiconductor die 310 including at least one component that has a characteristic which varies predictably with device temperature, as is further described below.

Figure 4A:
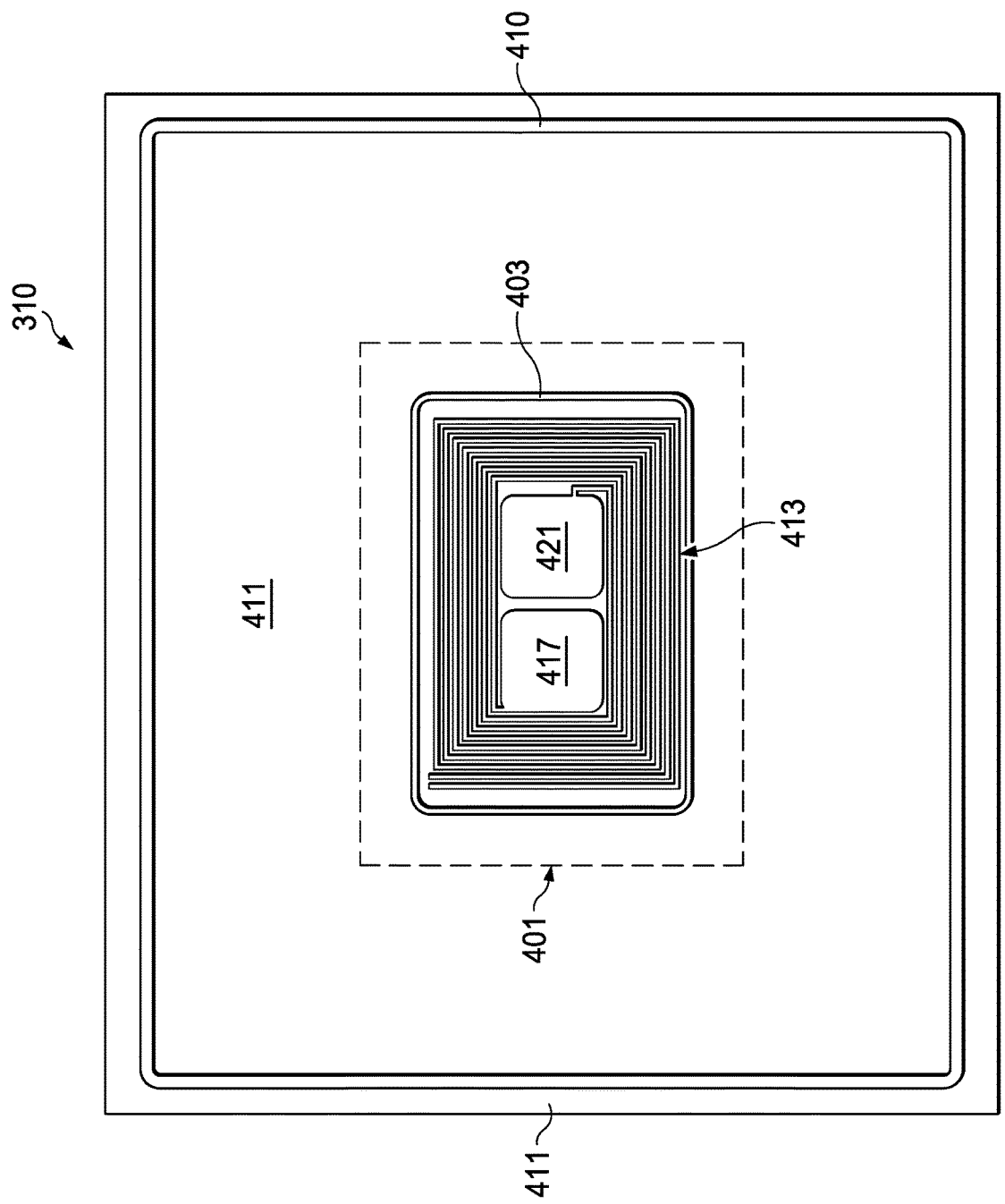
FIG. 4A illustrates, in a plan view, a semiconductor die of an arrangement including a temperature sensor.

FIG. 4A illustrates in a plan view an active surface of a semiconductor die 310 with a temperature sensor 401. The temperature sensor 401 has a temperature dependent characteristic and is formed using the dielectric and conductor materials of a metallization system for the semiconductor die 310. In an example, the metallization system is an aluminum metallization system with several aluminum conductor layers spaced from one another by corresponding layers of dielectric material, such as silicon dioxide or silicon oxynitride dielectric layers. Other dielectric materials can be used, for example, silicon carbon layers. In the illustrated example the temperature sensor 401 is formed in an upper layer of the metallization system, and in the illustrated example the sensor 401 is formed at the uppermost layer of the metallization layer. The temperature sensor 401 can be, in an example, a two terminal component. Bond pads 417, 421 are formed in the metallization system of semiconductor die 310 and coupled to each end of the two terminal temperature sensor 401. The bond pads 417, 421 provide an electrical interface to the temperature sensor 401, allowing connections to and from an external device to the temperature sensor.

The example temperature sensor 401 includes a low voltage ring 403, which is an isolation structure also formed of the conductor in an upper level of the metallization system. Low voltage ring 403 is a conductor that surrounds the two-terminal device and which can be electrically coupled to a low voltage ground, for example. In an alternative arrangement, low voltage ring 403 can be omitted. An electrical isolation structure is formed surrounding the temperature sensor 401. The electrical isolation structure is spaced from the temperature sensor 401 by a dielectric 411. As is further described below, the electrical isolation structure includes high voltage ring 410. In the electrical isolation structure, high voltage ring 410 is coupled to a semiconductor substrate (not visible in the plan view of FIG. 4A, see FIG. 4B) through a conductive path formed in the metallization system of the semiconductor die, including conductor materials at each level of the metallization system, and including filled conductive vias extending through the dielectric layers and making vertical connections between the conductor materials. The filled vias couple conductors formed at the various levels of the metallization layers to one another, and the isolation structure further comprises a contact structure made to the semiconductor substrate. The high voltage ring 410 surrounds the temperature sensor 401. The arrangement of the high voltage ring 410 and the dielectric materials forms a low voltage zone including the temperature sensor that is electrically isolated from the semiconductor substrate, which when in use, can be at a high voltage.

The conductor material 413 of the temperature sensor 401 can form a resistor which has a temperature dependent impedance. Alternatively the conductor material 413 can form a capacitor which has a temperature dependent permittivity. Alternative structures for the temperature sensor include an inductor or a coil. A resistor can be formed using conductor material 413 in a strip, spiral, circle, square or other two dimensional pattern to couple bond pads 417, 421 to one another. Use of dense patterns can increase the size of the resistor per unit area of the semiconductor device. A capacitor can be formed using two spirals or two other interleaved patterns in the conductor material 413, with the two portions in parallel and horizontally spaced from one another by the dielectric material 411. Interleaved fingers or strips of the conductor material 413 can be used. The capacitor then has a first plate coupled to the bond pad 417 and a second plate coupled to bond pad 421, to form a two terminal capacitor device. An RC circuit can be formed in the conductor layer, and the RC time constant can be used as a temperature sensor. As the impedance and permittivity of the RC components vary with temperature, the RC time constant will also vary with temperature.

Figure 4B:
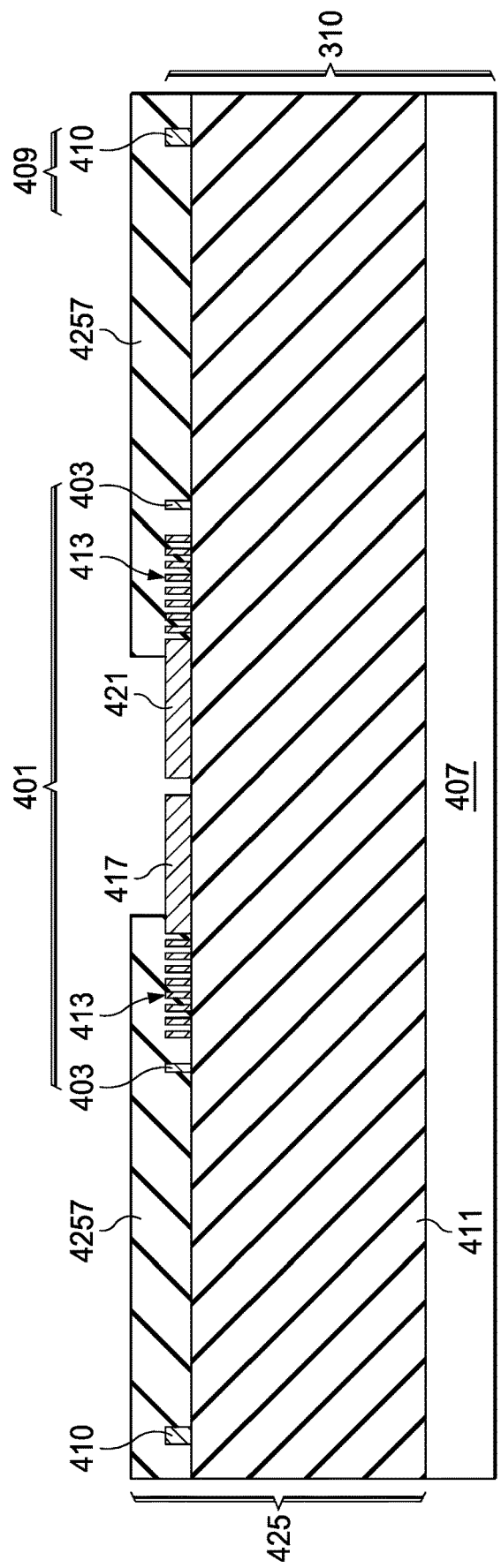
FIG. 4B illustrates, in a cross sectional view, some of the features of the temperature sensor of FIG. 4A.

FIG. 4B illustrates the semiconductor die 310 in a cross sectional view with some features of the temperature sensor 401 further illustrated. In the cross section, a metallization system 425 is shown with a layer of dielectric 411 at the upper layer, labeled 4257. In an example the metallization system 425 has multiple layers of conductors spaced form one another by corresponding layers of dielectric material. The conductor 413 of the temperature sensor 401 in the conductor material of the uppermost layer. The low voltage ring 403 can also be formed of the same uppermost layer conductor material, which can be aluminum for example, or copper, or alloys thereof. Bond pads 417, 421 are also formed of the same material in the upper layer 4257 of the metallization system and have an upper surface exposed from the dielectric materials to enable connection to a package lead. High voltage ring 410 is shown formed from the same conductor material in the upper layer of metallization system 425. The high voltage ring could alternatively be formed of another layer of the metallization system 425.

Figure 4C:
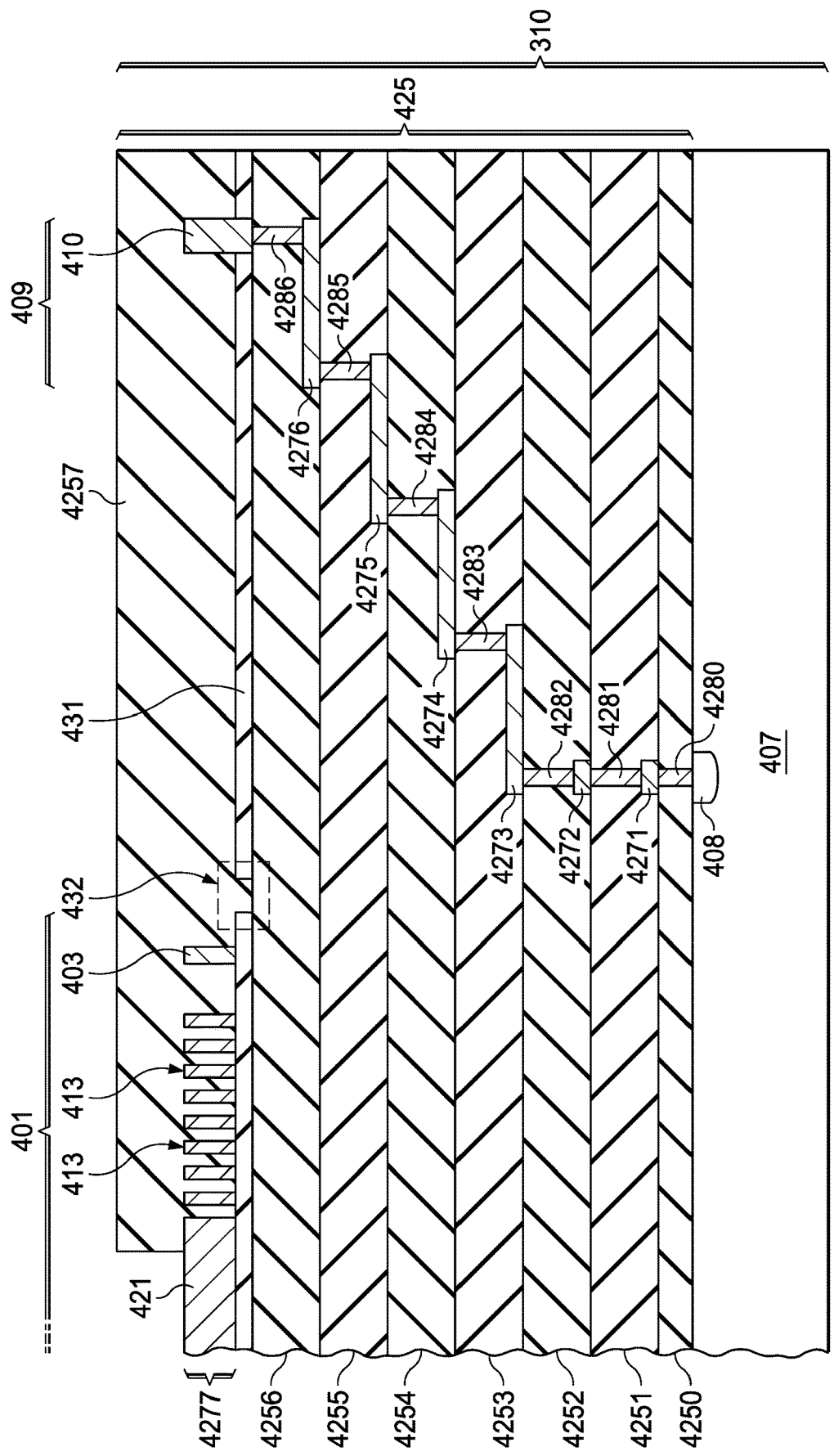
FIG. 4C illustrates, in a cross sectional view, a portion of a semiconductor die of FIGS. 4A-4B showing additional details of a temperature sensor of the arrangements.

FIG. 4C illustrates, in a partial cross section, additional details of the semiconductor die 310. In FIG. 4C, the cross section includes a portion of one of the bond pads, 421, and a portion of the temperature sensor of conductor material 413 and the low voltage ring 403, and the isolation structure 409. In FIG. 4C. the bond pad 421 is shown spaced from the conductors 413, and a low voltage isolation ring 403, is also spaced from the temperature sensor conductor 413. The isolation structure 409 includes a high voltage ring 410 that is also shown. The conductive elements including bond pad 421, temperature sensor conductor 413, the low voltage ring 403, and the high voltage ring 410, are shown formed in the uppermost metallization layer 4277 of the metallization system 425 overlying the active surface of the semiconductor substrate 407. Successive metallization layers are formed over the active surface of the semiconductor substrate 407.

A first conductor layer 4271 is formed in a first dielectric layer 4251 and is coupled to the next conductor layer 4272 by a first via layer 4281 that extends through dielectric layer 4251. The isolation structure 409 includes a series stack of conductors and vias in each of the dielectric layers 4251, 4252, 4253, 4255, 4256 with the conductor layers 4271, 4272, 4273, 4274, 4275, 4276 coupled vertically by corresponding via layers 4281, 4282, 4283, 4284, 4285 and 4286. The via layers extend through and couple the conductors through the dielectric layers 4251, 4252, 4253, 4255, 4256. In addition, a contact dielectric layer 4250 includes a contact via 4280 that is in ohmic contact with the semiconductor substrate 407 by use of a substrate contact, a doped region 408. In operation, the semiconductor substrate 407 will be placed in thermal contact and in electrical contact with a region where the temperature is to be measured, which can be at a high voltage.

In operation, the semiconductor substrate 407 will be coupled to the high voltage. The temperature sensor 401, including the conductor material 413 and the bond pad 421, will be thermally coupled to the semiconductor substrate 407, while remaining electrically isolated from the electric field from the high voltage that is present on the semiconductor substrate. The electrical isolation is by virtue of the dielectric layers and the isolation structure 409, which couples the high voltage to the high voltage ring 410 at the uppermost metallization layer. In this example a seven layer metallization system of aluminum or aluminum alloy conductors (4271, 4272 . . . 4277) is used over the semiconductor substrate, and together with seven dielectric layers (4251, 4252 . . . 4257) forms the seven metallization layers. More, or fewer, metallization layers can be used. A positive integer N can be used to describe the number of layers, and N is the uppermost layer, the first metallization layer above the substrate being metallization layer number 1. In example arrangements the number of layers ranges from N=4 to 12. Conductors other than aluminum, such as copper and copper alloys, can be used. The aluminum conductors are coupled vertically in isolation structure 409 using filled vias, such as tungsten vias or other conductor materials used to fill conductive vias in semiconductor processes. In a dual damascene copper process, copper or an alloy of copper can be used to form the conductors and to form and fill the vias.

FIG. 4C also shows an additional isolation feature, a dielectric layer 431, which is a silicon oxynitride (SON) layer below the uppermost metallization layer, this layer 431 has an opening 432 between the high voltage ring 410 and the temperature sensor 401. This opening 432 improves the performance by reducing or blocking charge transport at the die surface.

While shown in cross section in the figures, The isolation structure 409 can be continuous around the temperature sensor 401 and can form additional rings located at the various metallization layers, such as conductor 4276 (sixth layer in the example of seven layers), 4275, 4274, 4273, these rings form the low voltage zone including the temperature sensor 401.

Figure 5:
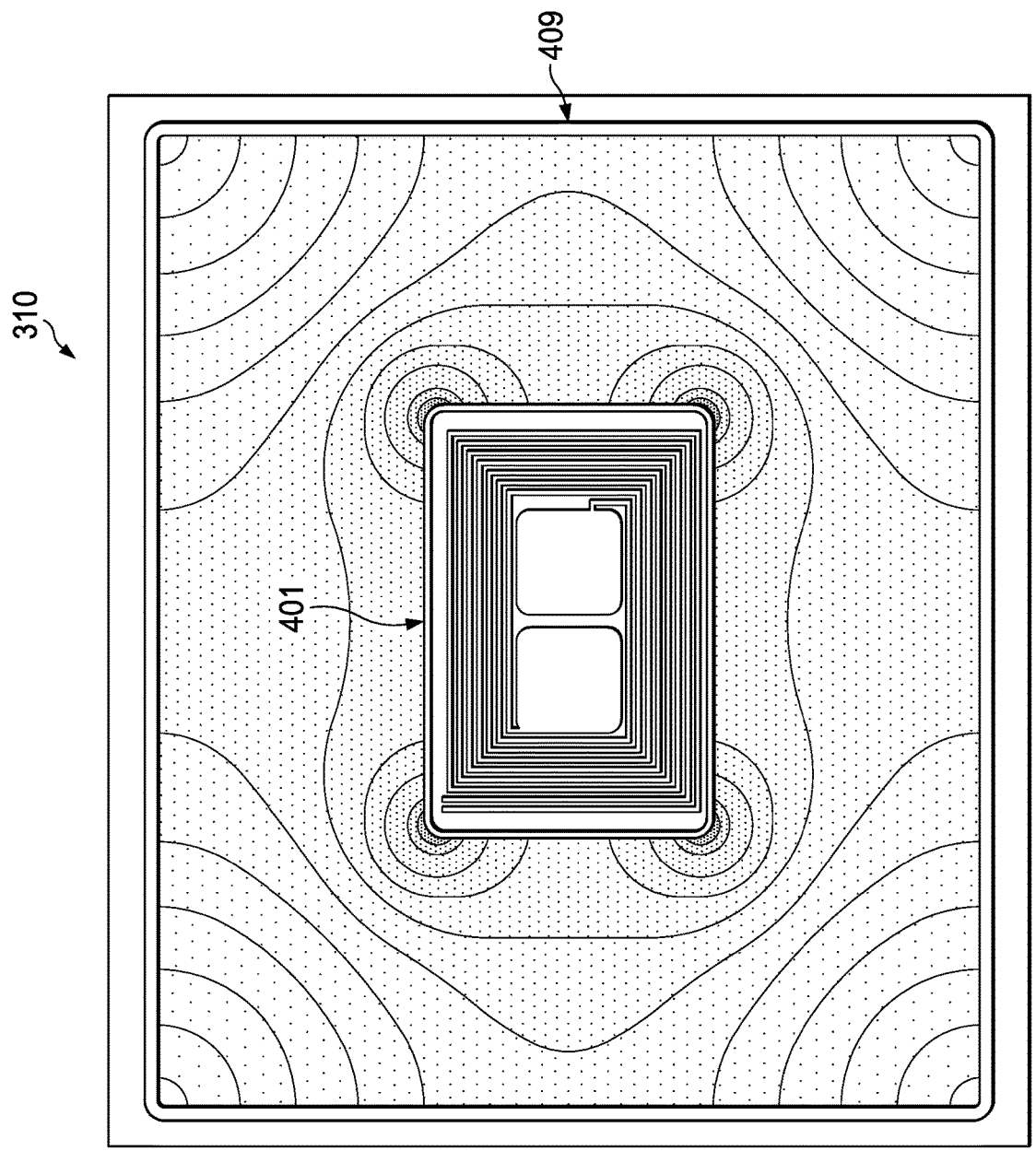
FIG. 5 illustrates, in a plan view, electric field simulation results for the temperature sensor of FIGS. 4A-4C.

FIG. 5 illustrates in a top view an e-field simulation result showing an e-field distribution using the arrangements. In FIG. 5, the temperature sensor 401 is shown in the center of the semiconductor die 310. A high voltage is applied to the semiconductor substrate (not visible) and coupled to the isolation structure 409, with the high voltage ring 410 at the high voltage. Equi-electric field lines indicate the field strength. As shown in FIG. 5, the resulting electric field is constrained and a low voltage zone including the temperature sensor 401 is formed, the temperature sensor 401 is isolated from the electric field due to the high voltage. The temperature sensor 401 is thus free from the dielectric breakdown effects that can occur when dielectric is exposed to high voltages. While the temperature sensor 401 is thermally coupled to the semiconductor substrate, it is electrically isolated from the semiconductor substrate.

Figure 6A:
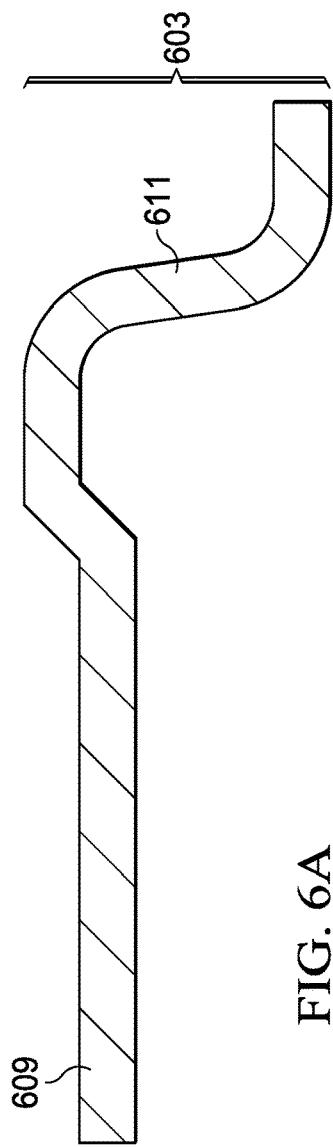
FIGS. 6A-6D illustrate in cross sectional views selected steps in forming a packaged semiconductor die with a temperature sensor in an arrangement.

FIGS. 6A-6D illustrate, in a series of cross sections, selected steps for forming a packaged electronic device including the thermal sensor of the arrangements. In FIG. 6A, a cross sectional view illustrates a package substrate 603, in this example a lead frame. The lead frame can be copper, plated copper, Alloy 42, steel, stainless steel, or another material used for lead frames in semiconductor packages. A first lead 611 is coupled to a die pad 609 configured to receive a semiconductor die. A second lead 605 is shown spaced from the die pad 609 and is isolated from and not in contact with the die pad 609 or the lead 611.

Figure 6B:
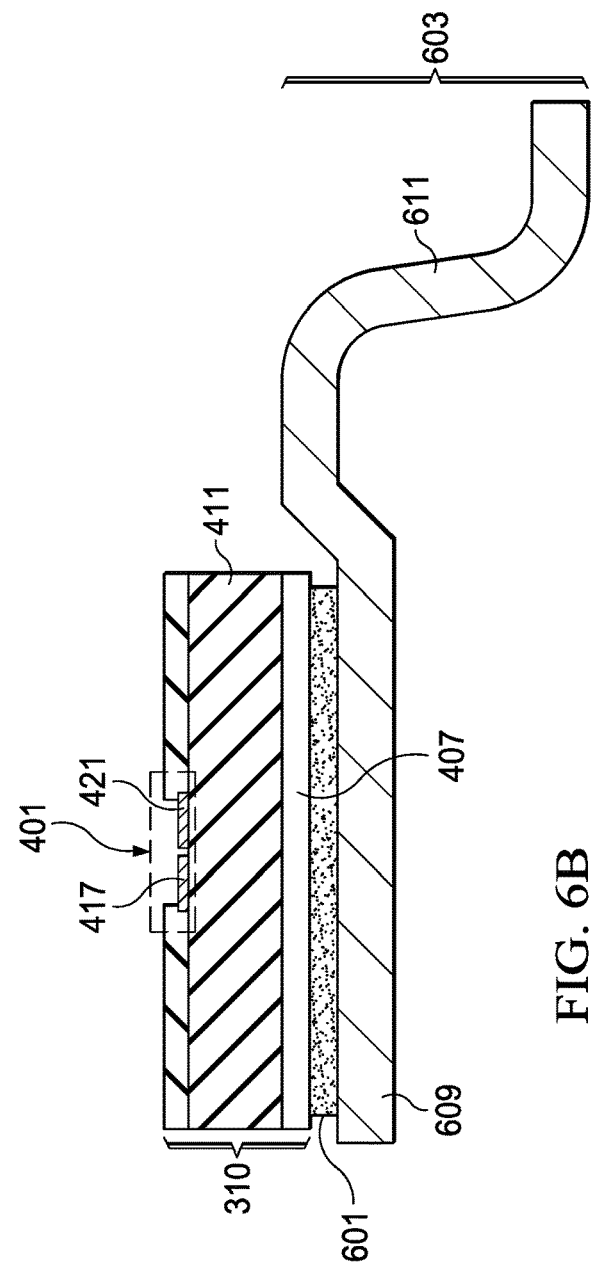

In FIG. 6B, the package substrate of FIG. 6A is shown in another cross section after further processing. The semiconductor die 310 is mounted on the die pad 609. A conductive die attach material 601 is used to bond a backside surface of the semiconductor die 310 to the die pad 609. Useful die attach materials include die attach films, pastes, and gels. Conductive die attach film is shown in the example. The semiconductor die 310 is mounted with an active surface facing away from the package substrate 603, in this example a lead frame. The temperature sensor 401 is shown with bond pads 417, 421 exposed from the dielectric 411. Lead 611 is coupled to the die pad 609, either by lead frame material, as shown here, or by a bond wire or ribbon bond.

Figure 6C:
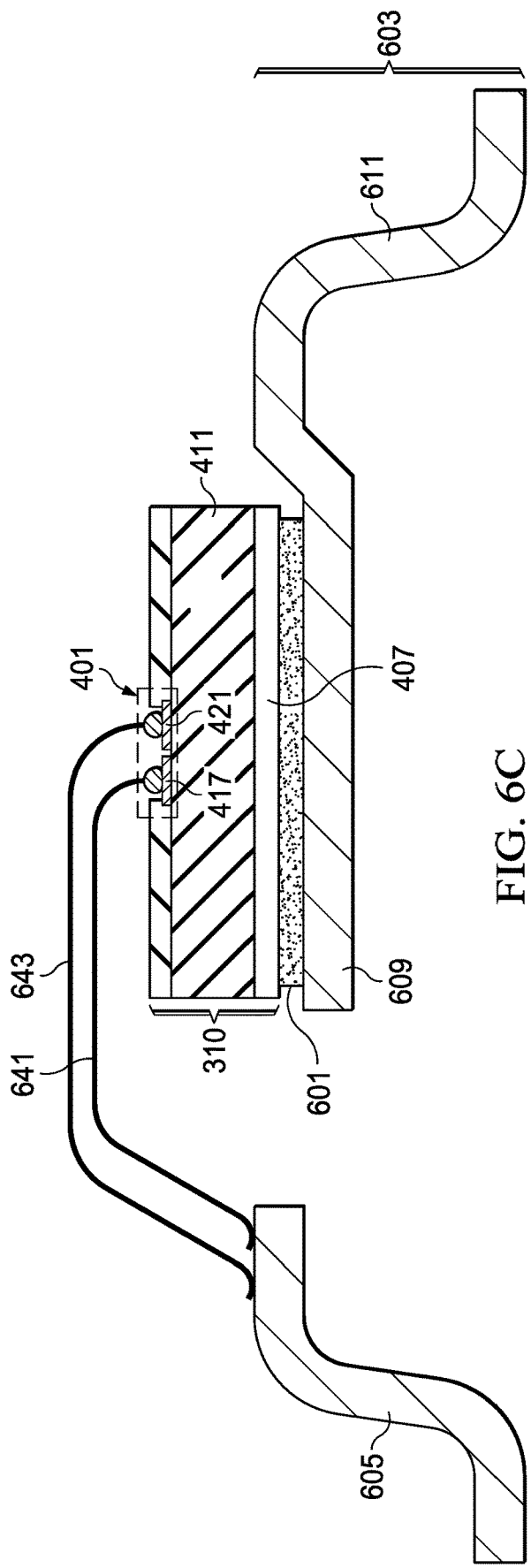

In FIG. 6C. the package substrate of FIG. 6B is shown after further processing. The semiconductor die 310 is electrically coupled to leads (a single lead 605 is visible in this cross section) by bond wires 641, 643. In processing, a wire bonder tool forms a free air ball at the end of bond wire extending through a capillary. The ball is bonded to a bond pad on the semiconductor die using thermal, mechanical, and/or sonic energy to make a ball bond to the bond pad, in FIG. 6C the ball bonds are shown on bond pads 417, 421 for example. As the capillary tool moves away from the ball bond, bond wire is allowed to extend through the capillary and forms arcs or curved wire shapes, the capillary moves to a position above a lead surface or a conductive land on a package substrate, and makes a stitch bond to the lead, this process is referred to as "ball and stitch" bonding. In FIG. 6C two bond wires 641, 643, are shown coupling the bond pads 417, 421 to leads with stitch bonds. The bond wires can be any used in semiconductor packaging, such as gold, copper, palladium coated copper, silver, and aluminum. Gold and palladium coated copper (PCC) bond wires are often used, although other bond wire types can be used in the arrangements. Alternative arrangements can use ribbon bonds instead of bond wires to couple the bond pads 417, 421 to the leads such as lead 605 of the package substrate 603.

Figure 6D:
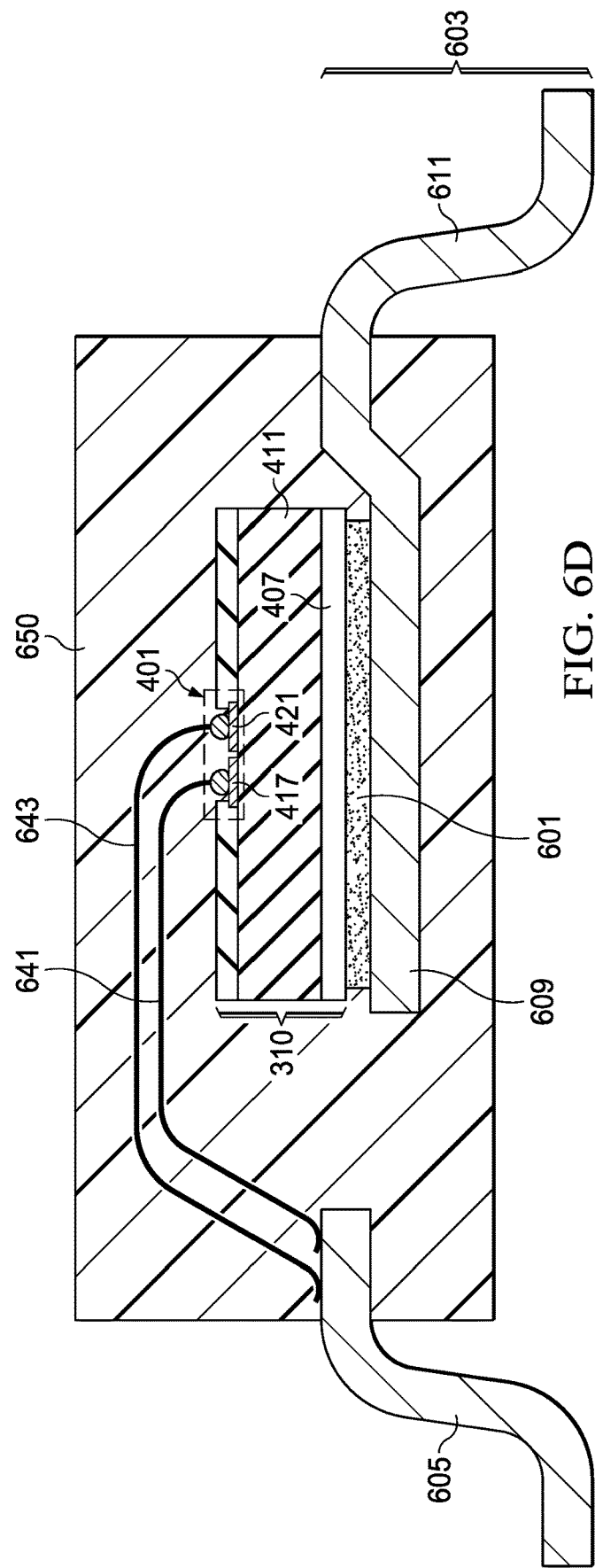

FIG. 6D illustrates in another cross sectional view the arrangement of FIG. 6C after additional processing. In FIG. 6D, the semiconductor die 310, including the thermal sensor 401, the bond wires 641, 643, and portions of the package substrate 603 are covered in mold compound 650. This encapsulation step can be performed as a block molding operation, or a unit molding operation, and a transfer mold can be used. Solid mold compound can be heated to a liquid state and then transferred into the mold under pressure and allowed to cure. The mold compound can be any mold compound material used in semiconductor packaging, in an example thermoset epoxy resin mold compound is used. Liquid resin or other epoxy material can be used to package the device and form mold compound 650.

In the steps shown in FIGS. 6A-6D, a single die 310 is shown being processed. However, in a production run, the package substrates such as lead frames may be provided in a package substrate with strips or arrays of lead frames in rows and columns. Many semiconductor dies can be mounted, wire bonded, and molded in the array or strip simultaneously, to provide production quantities and lower throughput time, lowering costs. The molded devices are separated after the molding using saws to cut through the mold compound and the package substrate in saw streets between the unit devices. The finished devices are then subjected to additional testing and trim and form operations on the leads to complete the packaged electronic devices.

Further, in the example arrangements, a single semiconductor die with the temperature sensor mounted on a die pad is shown. In additional arrangements, the die pad is a first die pad, and an additional die can be provided in the same package on a second die pad, isolated from the high voltage on the first die pad. This additional semiconductor die can be a data analysis circuit, and can include an analog to digital converter (ADC) and a digital processing circuit configured to compute or derive the temperature from an analog signal passing through the temperature sensor. In this manner a complete temperature sensor solution may be provided in a single packaged semiconductor device.

Figure 7:
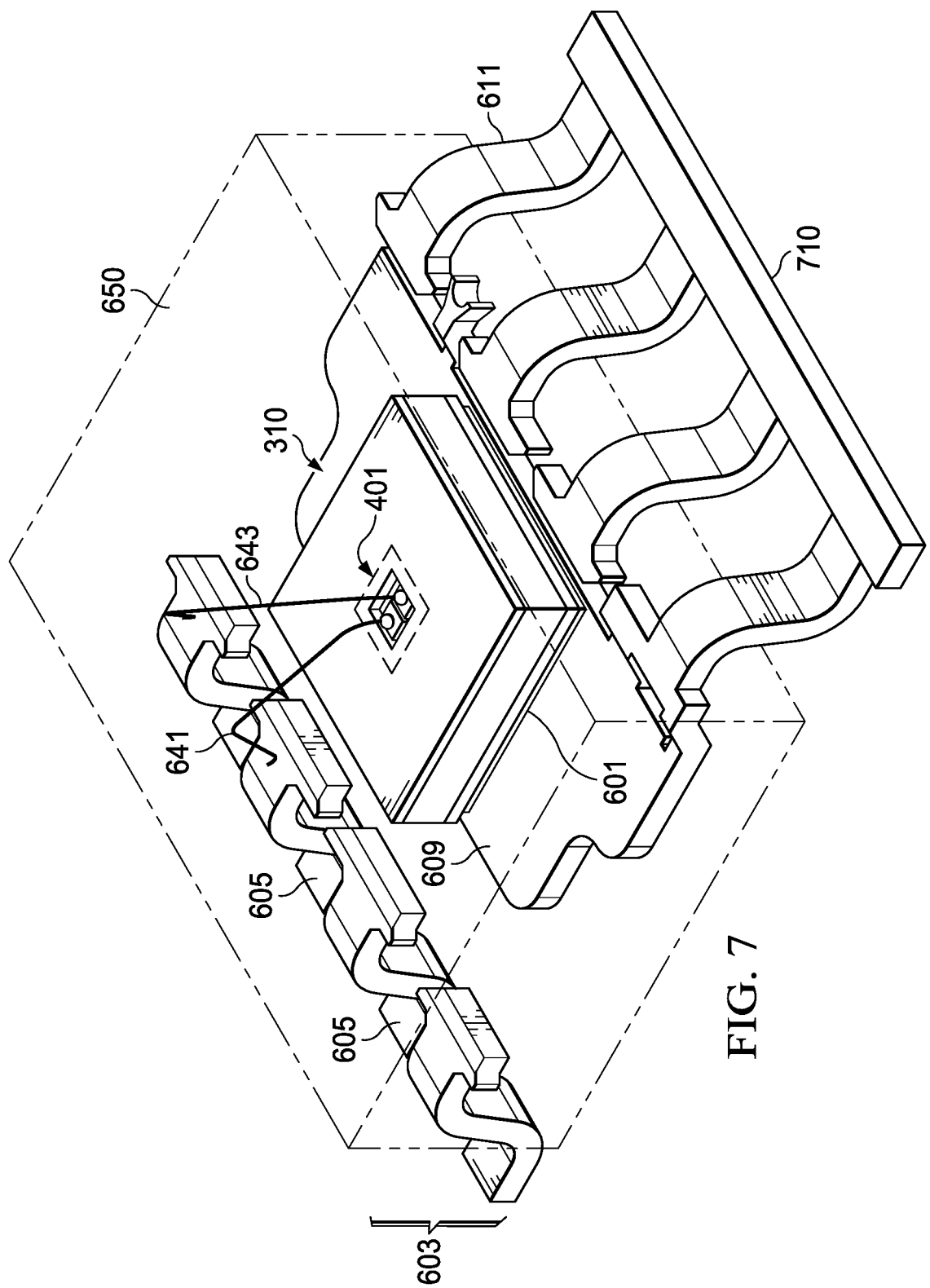
FIG. 7 illustrates in a projection view a packaged semiconductor die with a temperature sensor in an arrangement with a leaded package, coupled to a bus.

FIG. 7 illustrates, in a projection view, the packaged device including is shown in an application with the thermal sensor 401 and the semiconductor die 310. The lead 611 is coupled to the die pad 609 and is placed on a bus 710 where the temperature is to be measured. The bus 710 can be a conductive trace on a system board that carries a high voltage, for example a voltage greater than 100 Volts, greater than about 1 kilovolt and up to several thousand volts. The temperature sensor 401 on the semiconductor die 310 is coupled to leads 605 by bond wires 641, 643. The temperature sensor 401 can be coupled to an external circuit for measuring a current, a voltage, or changes in a current or voltage, and the temperature of the temperature sensor 401 can be determined using calibration measurements stored in the external device, for example in a non-volatile look up table. The temperature of the bus 710 can also be determined by calibration or can be estimated as equal to the temperature of the temperature sensor 401, which is in thermal contact with the bus 710. Using experimentation, offsets can be determined to make the measured temperature more accurate, the offsets can be stored in the external device.

Figure 8:
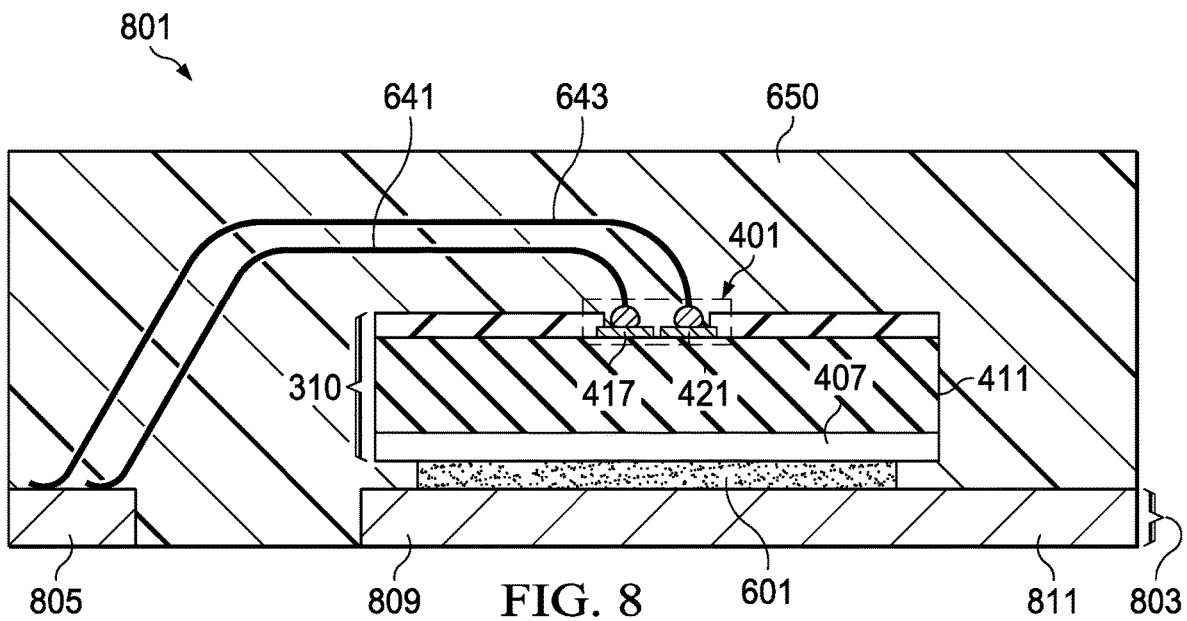
FIG. 8 illustrates, in an alternative arrangement, a semiconductor die with a temperature sensor in a no-leads package.

FIG. 8 illustrates, in a cross sectional view, an alternative packaged device 801 in a quad flat no-lead package. A package substrate 803 is used to mount the semiconductor die 310 on a die pad. The package substrate 803 has exposed portions that form leads 811, and leads 805. The bond wires 641, 643 couple the bond pads 417, 421 of the temperature sensor 401 to the leads 805. The mold compound 650 covers the semiconductor die 310, the bond wires, the temperature sensor 401, and portions of the package substrate 803, while the leads have portions exposed from the mold compound 650. No lead packages are increasingly used because the board area needed to mount these packages is reduced when compared to the leaded package of FIG. 7, for example.

Figure 9:
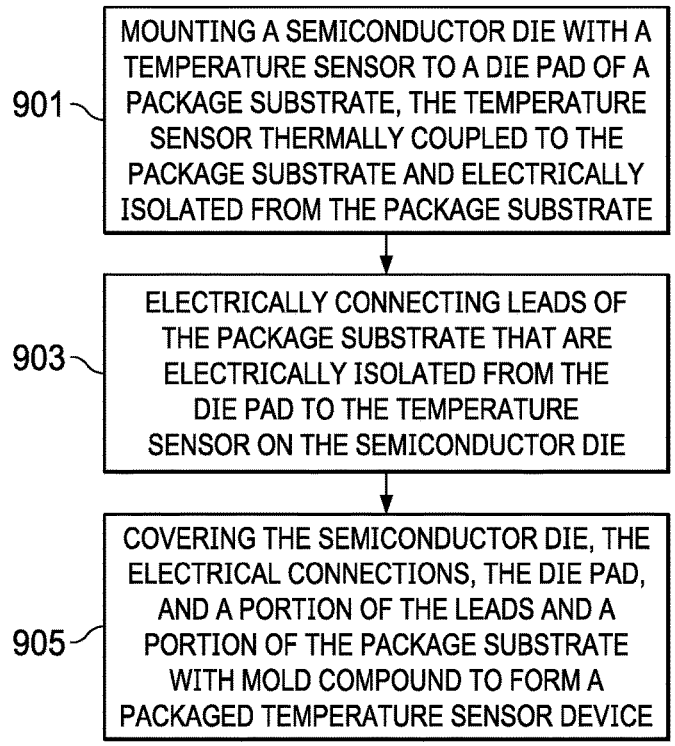
FIG. 9 illustrates in a flow diagram a method for forming a packaged temperature sensor device of the arrangements.

FIG. 9 illustrates, in a flow diagram, a method for forming a temperature sensor. At step 901, a semiconductor die including a temperature sensor formed in an upper metallization layer is mounted to a die pad of a package substrate. The temperature sensor is electrically isolated from the package substrate, but thermally coupled to it (see FIGS.

6A-6B). At step 903, the temperature sensor is electrically connected to leads of the package substrate that are isolated from the die pad. (See FIG. 6C). At step 905, the semiconductor die, the electrical connections, the die pad, and a portion of the leads and a portion of the package substrate are covered with mold compound to form a packaged temperature sensor device. (See FIG. 6D). In operation, the temperature sensor device can be coupled to a conductor or surface at a high voltage without exposing the temperature sensor on the semiconductor die to the high voltage (see FIG. 7). Use of the arrangements provides a high voltage compatible temperature sensor without risk of dielectric breakdown from the electric fields associated with the high voltage.

Modifications are possible in the described arrangements, and other alternative arrangements are possible within the scope of the claims.

What is claimed is:

1. An apparatus, comprising:
   a package substrate comprising a die pad configured for mounting a semiconductor die, a first lead connected to the die pad, and a second lead and a third lead spaced from and isolated from the first lead and the die pad;
   a semiconductor die including a temperature sensor mounted on the die pad, comprising:
      a semiconductor substrate having a backside surface conductively mounted to the die pad and having an active surface opposite the backside surface;
      successive metallization layers stacked over the active surface of the semiconductor die, a first metallization layer being the metallization layer closest to the active surface, and the successive metallization layers overlying a previous metallization layer, an uppermost metallization layer being furthest from the active surface, the successive metallization layers comprising a respective conductor layer in a dielectric material for a particular metallization layer, and including conductive vias extending through the dielectric material from the respective conductor layer to adjacent metallization layers;
      the temperature sensor formed of the respective conductor layer in the uppermost metallization layer; and
   a high voltage ring formed of the respective conductor layer in the uppermost metallization layer, the high voltage ring spaced from the temperature sensor and surrounding the temperature sensor;
      bond pads formed of the conductor layer in the uppermost metallization layer, configured for making an electrical connection; and
   electrical connections coupling the bond pads to the second lead and to the third lead.

2. The apparatus of claim 1, and further comprising:
   an isolation structure including the high voltage ring comprising a portion of the respective conductor layer of each of the successive metallization layers between the uppermost metallization layer and the first metallization layer, the conductor layers of the isolation structure coupled to adjacent ones of the conductor layers by conductive vias, and a conductor layer of the first metallization layer further coupled to the active surface of the semiconductor substrate by a contact via and a contact.

3. The apparatus of claim 1, and further comprising:
   a low voltage ring formed of the respective conductor layer in the uppermost metallization layer and surrounding the temperature sensor, the low voltage ring placed between the temperature sensor and the high voltage ring.

4. The apparatus of claim 1, wherein the metallization layers are in N successive metallization layers with the Nth layer being the uppermost layer, wherein N is a positive integer in a range from 4 to 12.

5. The apparatus of claim 1, wherein the temperature sensor further comprises an impedance.

6. The apparatus of claim 5, wherein the impedance further comprises a continuous portion of the respective conductor layer in the uppermost metallization layer, arranged in a spiral shape and having two ends.

7. The apparatus of claim 5 wherein the impedance further comprises a continuous portion of the conductor layer in the uppermost metallization layer having two ends.

8. The apparatus of claim 5, wherein the temperature sensor further comprises a capacitance.

9. The apparatus of claim 8, wherein the capacitance is formed from two portions of the respective conductor in the uppermost layer of metallization, the two portions arranged spaced by the dielectric of the uppermost metallization layer with a uniform spacing distance between them.

10. The apparatus of claim 9, wherein the capacitance is formed from two spiral portions of the conductor in the uppermost layer of metallization.

11. The apparatus of claim 9, and further comprising a first bond pad formed from the conductor in the uppermost level of the metallization layer and coupled to a first one of the two portions of the capacitance, and a second bond pad formed from the conductor in the uppermost level of the metallization layer and coupled to the second one of the two portions of the capacitance.

12. The apparatus of claim 1, and further comprising a silicon oxynitride layer formed between the uppermost layer of the metallization layers and an underlying layer of the metallization layers, and having a lateral opening in the silicon oxynitride layer between the temperature sensor and the high voltage ring.

13. The apparatus of claim 1, wherein the package substrate includes leads coupled to the die pad, and the leads coupled to the die pad are configured to be placed in contact with a high voltage signal on a system board.

14. The apparatus of claim 1, wherein the temperature sensor is configured to sense the temperature of the semiconductor substrate, while being electrically isolated from the semiconductor substrate by the dielectric material in the successive metallization layers.

15. The apparatus of claim 1, wherein the bond pads further comprise a first bond pad and a second bond pad formed from the respective conductor in the uppermost metallization layer, the first and second bond pads electrically connected to the second and third leads on the package substrate, the second and third leads providing terminals configured for coupling the temperature sensor to an external device.

16. A method, comprising:
   mounting a semiconductor die including a temperature sensor to a die pad of a package substrate, the temperature sensor formed in a conductor layer of an uppermost one of successive metallization layers formed over an active surface of the semiconductor die, the successive metallization layers including a respective conductor layer in a dielectric material and including conductive vias coupled to the respective conductor layers and extending through the dielectric material to respective conductor layers in adjacent metallization layers, the die pad electrically connected to a first lead of the package substrate;

coupling the temperature sensor to bond pads, the bond pads electrically connected to a second lead and to a third lead of the package substrate, respectively, the second lead and the third lead spaced from and isolated from one another and from the die pad and the first lead;

placing the first lead into electrical and thermal contact with a high voltage trace; and using the second lead and the third lead, monitoring a physical characteristic of the temperature sensor to determine a temperature.

17. The method of claim 16, and further comprising monitoring a current through the temperature sensor.

18. The method of claim 16, and further comprising monitoring a voltage through the temperature sensor.

19. The method of claim 16, wherein the temperature sensor comprises an impedance formed of the respective conductor layer of the uppermost metallization layer.

20. The method of claim 16, wherein the temperature sensor comprises a capacitance formed of the respective conductor layer of the uppermost metallization layer.

21. A packaged temperature sensor device, comprising:
a metal lead frame having a die pad that is connected to a first lead;
a second lead and a third lead of the metal lead frame spaced from the die pad and the first lead, and isolated from the die pad;
a semiconductor die mounted to the die pad including a temperature sensor, comprising:
a semiconductor substrate having a backside surface conductively mounted to the die pad and having an active surface opposite the backside surface;
successive metallization layers stacked over the active surface of the semiconductor die, a first metallization layer closest to the active surface, and each successive metallization layer overlying a previous metallization layer, the uppermost metallization layer being the furthest metallization layer from the active surface, the metallization layers comprising a respective conductor layer in a dielectric material, and including conductive vias extending from the respective conductor layer to respective conductor layers in adjacent metallization layers;
the temperature sensor formed of the respective conductor layer in the uppermost metallization layer, and a high voltage ring formed of the respective conductor layer in the uppermost metallization layer, the high voltage ring spaced from the temperature sensor and surrounding the temperature sensor; and
bond pads formed in the uppermost metallization layer, the bond pads configured for making electrical connections;
electrical connections comprising bond wires connecting the second lead and third lead to the bond pads on the semiconductor die; and
mold compound covering the semiconductor die, the bond wires, and portions of the second lead and the third lead, while additional portions of the second lead and the third lead are exposed from the mold compound, forming terminals for the packaged temperature sensor device.

* * * * *